United States Patent
Kim et al.

(10) Patent No.: US 8,285,087 B2
(45) Date of Patent: Oct. 9, 2012

(54) OPTICAL INTERCONNECTION SYSTEM USING OPTICAL PRINTED CIRCUIT BOARD HAVING ONE-UNIT OPTICAL WAVEGUIDE INTEGRATED THEREIN

(75) Inventors: Do Won Kim, Daejeon (KR); Tae Woo Lee, Daejeon (KR); Hyo Hoon Park, Daejeon (KR)

(73) Assignee: Korea Advanced Institute of Science and Technology (KAIST), Daejeon (KR)

( * ) Notice: Subject to any disclaimer, the term of this patent is extended or adjusted under 35 U.S.C. 154(b) by 932 days.

(21) Appl. No.: 12/227,995

(22) PCT Filed: Sep. 22, 2008

(86) PCT No.: PCT/KR2008/005627
§ 371 (c)(1),
(2), (4) Date: Dec. 3, 2008

(87) PCT Pub. No.: WO2009/041771
PCT Pub. Date: Apr. 2, 2009

(65) Prior Publication Data
US 2010/0232741 A1  Sep. 16, 2010

(30) Foreign Application Priority Data
Sep. 28, 2007 (KR) .................. 10-2007-0097998

(51) Int. Cl.
*G02B 6/10* (2006.01)
*G02B 6/12* (2006.01)
*G02B 6/36* (2006.01)
(52) U.S. Cl. ............... 385/14; 385/49; 385/88; 385/129
(58) Field of Classification Search ............ 385/14, 385/49, 88, 89, 92–94, 129–132; 398/135–139
See application file for complete search history.

(56) References Cited

U.S. PATENT DOCUMENTS
5,258,868 A  11/1993 Jensen et al.
(Continued)

FOREIGN PATENT DOCUMENTS
KR  1020070061604  22/2007
(Continued)

OTHER PUBLICATIONS
Steenberge et al, "MT-Compatible Laser-Ablated Interconnections for Optical Printed Circuit Boards" Journal of Lightwave Technology, vol. 22, No. 9, Sep. 2004, pp. 2083-2090.
(Continued)

*Primary Examiner* — Charlie Peng
*Assistant Examiner* — Mary El Shammaa
(74) *Attorney, Agent, or Firm* — Wells St. John P.S.

(57) ABSTRACT

An optical interconnection system is provided and includes an optical printed circuit board (PCB) that includes transmitter-unit and receiver-unit optical interconnection blocks for bending an optical path by a predetermined angle, a one-unit optical waveguide including an optical waveguide which is inserted into each of the optical interconnection blocks so as to connect optical paths of the transmitter-unit and receiver-unit optical interconnection blocks, and a PCB having the one-unit optical waveguide integrated therein; a light emitting element that is formed in-line with the optical waveguide on an upper surface of the transmitter-unit optical interconnection block exposed to an upper surface of the optical PCB; a driver integrated circuit that is formed on the upper surface of the optical PCB and electrically connected to the light emitting element and the optical PCB; a light receiving element that is formed in-line with the optical waveguide on an upper surface of the receiver-unit optical interconnection block exposed to the upper surface of the optical PCB; and a receiver integrated circuit that is formed on the upper surface of the optical PCB and electrically connected to the light receiving element and the optical PCB.

14 Claims, 12 Drawing Sheets

U.S. PATENT DOCUMENTS

| | | |
|---|---|---|
| 6,091,740 A | 7/2000 | Karasawa |
| 6,154,462 A | 11/2000 | Coden |
| 6,285,808 B1 | 9/2001 | Mehlhorn |
| 6,755,575 B2 | 6/2004 | Kronlund et al. |
| 6,788,681 B1 | 9/2004 | Hurren et al. |
| 6,898,205 B1 | 5/2005 | Chaskar et al. |
| 6,963,575 B1 | 11/2005 | Sistanizadeh et al. |
| 6,973,248 B2 * | 12/2005 | Kropp .......................... 385/131 |
| 7,062,144 B2 * | 6/2006 | Hwang et al. ................. 385/139 |
| 7,263,256 B2 * | 8/2007 | Kim et al. ....................... 385/32 |
| 7,305,156 B2 | 12/2007 | Mohammed |
| 7,436,784 B2 | 10/2008 | Hashimoto |
| 7,441,965 B2 | 10/2008 | Furuno et al. |
| 7,564,779 B2 | 7/2009 | Rose et al. |
| 7,606,240 B1 | 10/2009 | Shah |
| 7,712,976 B2 | 5/2010 | Aronson et al. |
| 7,733,807 B2 | 6/2010 | Takefman |
| 2003/0185484 A1 | 10/2003 | Chakravorty et al. |
| 2004/0170184 A1 | 9/2004 | Hashimoto |
| 2005/0135379 A1 | 6/2005 | Callaway et al. |
| 2006/0098571 A1 | 5/2006 | Takefman |
| 2006/0153218 A1 | 7/2006 | Shakhov |
| 2006/0263012 A1 | 11/2006 | Yamazaki |
| 2007/0008964 A1 | 1/2007 | Rose et al. |
| 2007/0177588 A1 | 8/2007 | Lee et al. |
| 2007/0258683 A1 | 11/2007 | Rolston et al. |
| 2008/0095047 A1 | 4/2008 | Skalecki et al. |
| 2008/0130490 A1 | 6/2008 | Yu et al. |
| 2008/0285975 A1 | 11/2008 | Lee et al. |
| 2008/0317030 A1 | 12/2008 | Rhee et al. |
| 2009/0216922 A1 | 8/2009 | Park et al. |

FOREIGN PATENT DOCUMENTS

| | | |
|---|---|---|
| KR | 1020010016359 A | 3/2001 |
| KR | 1020010096855 A | 8/2001 |
| KR | 1020040089014 A | 10/2004 |
| KR | 10200504564 A | 5/2005 |
| KR | 1020070046367 | 8/2007 |
| KR | 1020070097998 | 9/2007 |
| KR | 1020070108391 | 10/2007 |
| KR | 1020080017415 | 2/2008 |
| KR | 1020080035344 | 4/2008 |
| WO | PCT/KR2008/005627 | 9/2008 |

OTHER PUBLICATIONS

Im, et al.; "Managed FDB Algorithm and Protection in Ethernet Ring Topology", Coin—ACOFT 2007 Conference, Melbourne, Australia; Jul. 24-27, 2007; 3 pages.

* cited by examiner

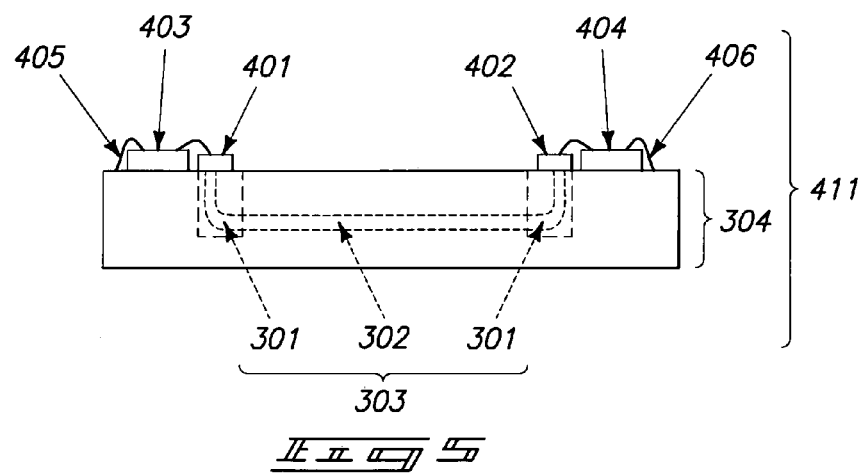
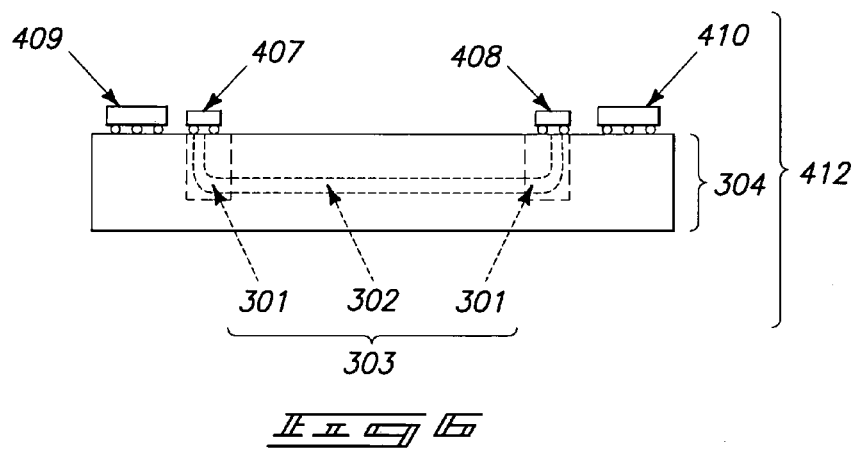
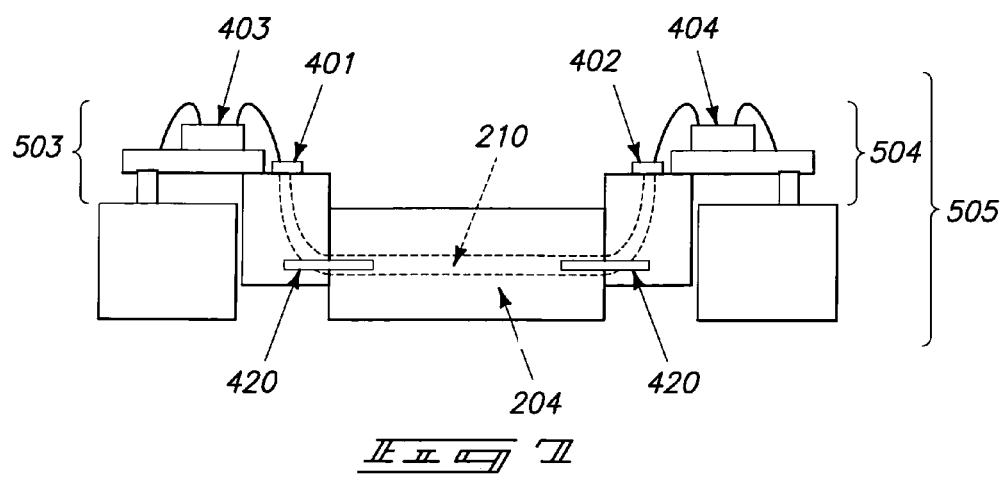

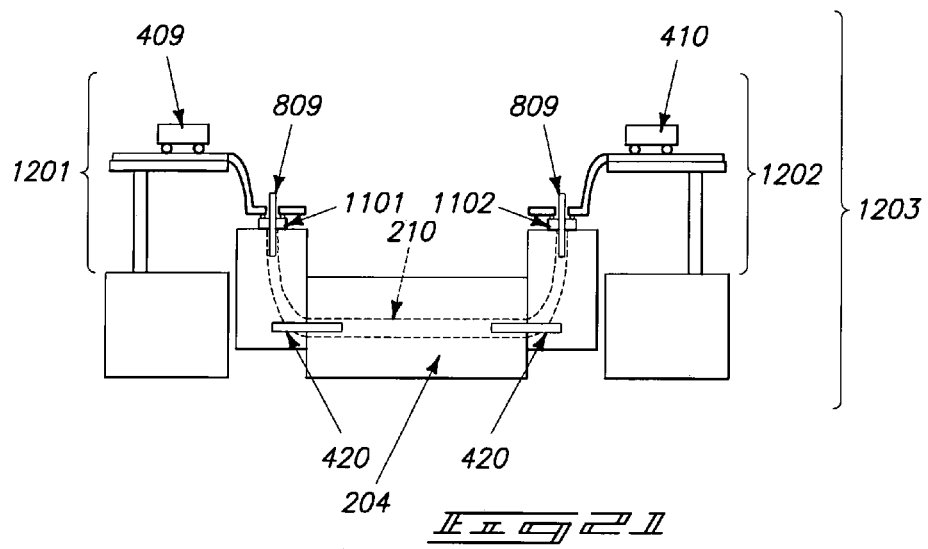
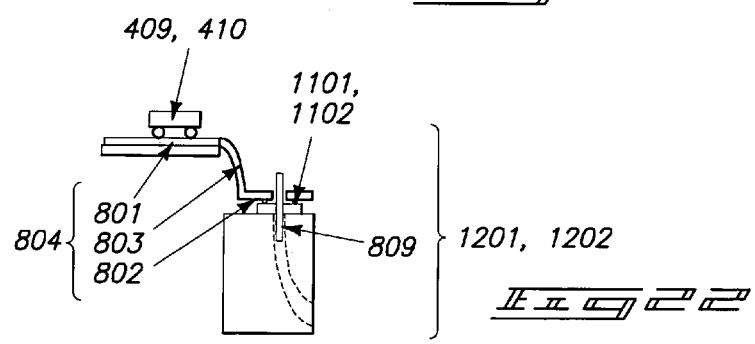
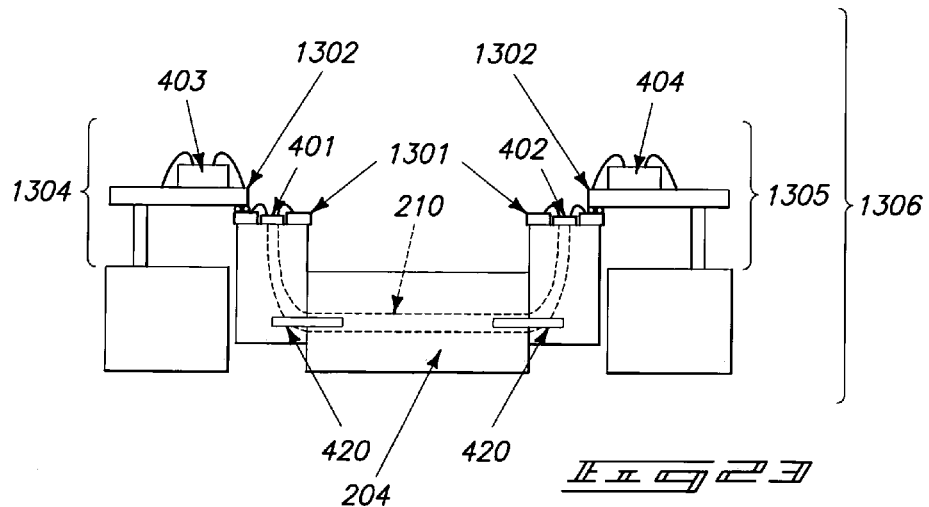

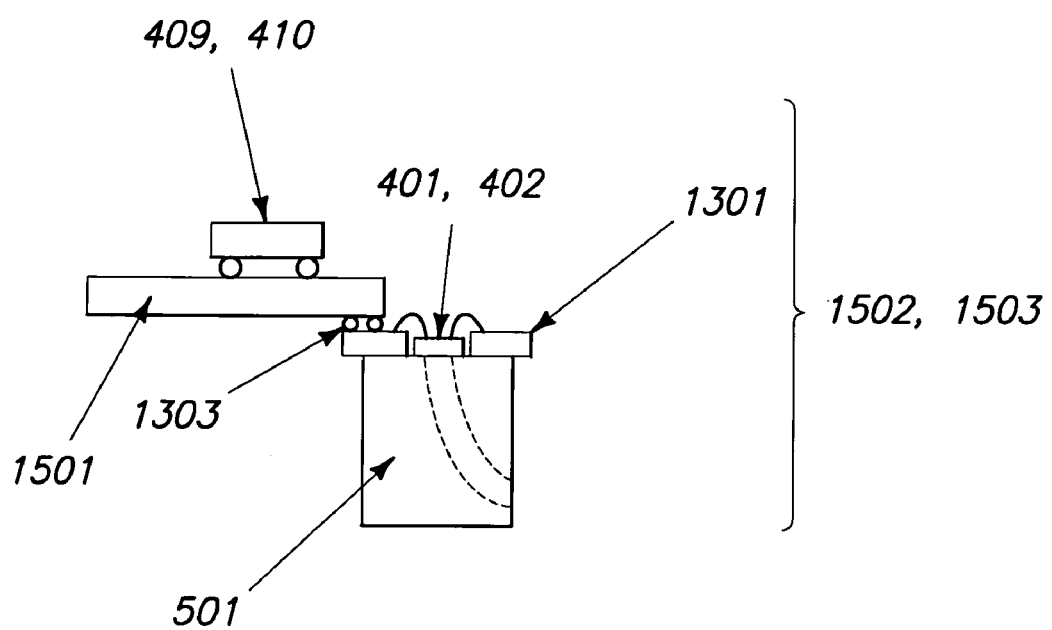

OPTICAL INTERCONNECTION SYSTEM USING OPTICAL PRINTED CIRCUIT BOARD HAVING ONE-UNIT OPTICAL WAVEGUIDE INTEGRATED THEREIN

RELATED PATENT DATA

This application is a 35 U.S.C. §371 National Stage Application of and claims priority to International Application No. PCT/KR2008/005627, which was filed on Sep. 22, 2008, and which claims priority to Korean Application No. KR10-2007-0097998, which was filed on Sep. 28, 2007, the teachings of all priority documents are incorporated herein by reference.

TECHNICAL FIELD

The present invention relates to an optical interconnection system using an optical printed circuit board (PCB) having an one-unit optical waveguide integrated therein, and more specifically, to an optical interconnection system which includes an one-unit optical waveguide formed by inserting an optical waveguide into a transmitter-unit optical interconnection block and a receiver-unit optical interconnection block to minimize optical loss, and in which an optical transmitter module and an optical receiver module are connected to an optical PCB having the one-unit optical waveguide provided therein to minimize optical loss.

BACKGROUND ART

The ongoing development of micro-processor technology has increased the operation speed of micro-processors to the present level of tens of Gb/s. However, limited by electrical connections, they cannot keep up with similarly high data speeds. To overcome the limitations of electrical connections, optical interconnections have been proposed. Since optical interconnections between chips or boards enable high-speed signal transmission, high-density wiring lines, and low power consumption, they further enhance the signal processing ability of large-scale computers and next-generation mobile communication systems.

To effectively transmit optical signals, it is essential that passive optical elements as well as active optical elements, for example, an optical interconnection block and an optical waveguide, are mounted or connected in such a manner that optical power can be minimized. Optical signals applied to an optical PCB are transmitted through the following process. The direction of an optical signal emitted from an optical transmitter element, for example, semiconductor laser, is deflected 90 degrees in an optical interconnection block so as to pass through an optical waveguide formed of a polymer or silica fiber installed in the optical PCB. Then, the optical signal is delivered through an optical interconnection block to an optical receiver element, for example, a photodiode.

Korean Patent Laid-open Publication Nos. 10-2004-0089014 and 10-0575951 shown in FIGS. 1 and 2 disclose a method of passively connecting optical elements for high-precision alignment by using guide pins 202. In such a method, high optical efficiency can be achieved and an optical interconnection system can be easily manufactured.

However, a separate PCB 203 for mounting the optical transmitter and/or receiver modules 205 to 208 is needed, and noise may occur in a line for transmitting electrical signals between the separate PCB 203 and an optical PCB 204. Further, during a process of connecting the optical PCB 204 to optical interconnection blocks 101, an alignment error inevitably occurs between the light emitting and receiving elements 205 and 206 and the optical interconnection blocks 101, and between the optical interconnection blocks 101 and an optical waveguide 210 of the optical PCB 204. In this case, optical loss occurs.

Further, since the guide pins 202 are used, the optical elements may come off due to vibration or deform due to temperature change when the optical interconnection system is used. Therefore, it is impossible to guarantee stable operation of the system for a long time. Furthermore, the connection operation between the optical elements through the guide pins 202 is not easy to perform, and the optical fiber within the optical interconnection blocks 101 may be damaged during the operation.

DISCLOSURE

Technical Problem

An object of the present invention is to provide an optical interconnection system in which an optical PCB is formed with an one-unit optical waveguide formed by integrally connecting optical interconnection blocks and optical-waveguide fiber to minimize optical loss.

Another object of the present invention is to provide an optical interconnection system which has a compact structure in which optical transmitter or receiver elements are packaged in an optical PCB and can reduce noise through additional electric lines.

Still another object of the present invention is to provide an optical interconnection system which can stably operate for a long time, without being affected by environmental factors such as vibration and heat.

Technical Solution

According to an aspect of the invention, an optical interconnection system includes an optical printed circuit board (PCB) that includes transmitter-unit and receiver-unit optical interconnection blocks for bending an optical path by a predetermined angle, an one-unit optical waveguide including an optical waveguide which is inserted into each of the optical interconnection blocks so as to connect optical paths of the transmitter-unit and receiver-unit optical interconnection blocks, and a PCB having the one-unit optical waveguide integrated therein; a light emitting element formed in-line with the optical waveguide on an upper surface of the transmitter-unit optical interconnection block exposed to an upper surface of the optical PCB; a driver integrated circuit formed on the upper surface of the optical PCB and electrically connected to the light emitting element and the optical PCB; a light receiving element formed in-line with the optical waveguide on an upper surface of the receiver-unit optical interconnection block exposed to the upper surface the of optical PCB; and a receiver integrated circuit formed on the upper surface of the optical PCB and electrically connected to the light receiving element and the optical PCB. The upper surfaces of the respective optical interconnection blocks are substantially aligned with the upper surface of the PCB.

The light emitting element may be a bottom-surface light emitting element, the bottom-surface light emitting element and the driver integrated circuit may be connected to each other through wire bonding, and the driver integrated circuit and the optical PCB may be connected to each other through wire bonding. The light receiving element may be a bottom-surface light receiving element, the bottom-surface light receiving element and the receiver integrated circuit may be connected to each other through wire bonding, and the receiver integrated circuit and the optical PCB may be connected to each other through wire bonding. The light emitting element may be an top-surface light emitting element having bumps provided thereon, the light receiving element may be an top-surface light receiving element having bumps provided thereon, the driver integrated circuit and the receiver integrated circuit may have bumps provided thereon, and the top-surface light emitting element, the driver integrated circuit, the top-surface light receiving element, and the receiver integrated circuit may be packaged on the optical PCB through the bumps by flip-chip bonding.

According to another aspect of the invention, an optical interconnection system includes an optical transmitter module that includes a transmitter-unit optical interconnection block for bending an optical path by a predetermined angle, a light emitting element formed in-line with an optical waveguide of the optical interconnection block, a driver integrated circuit connected to the light emitting element, and a module PCB having the driver integrated circuit formed on an upper surface thereof; an optical receiver module that includes a receiver-unit optical interconnection block for bending an optical path by a predetermined angle, a light receiving element formed in-line with an optical waveguide of the optical interconnection block, a receiver integrated circuit connected to the light receiving element, and a module PCB having the receiver integrated circuit formed on an upper surface thereof; and an optical PCB that includes an optical waveguide connecting the optical interconnection block of the optical transmitter module and the optical interconnection block of the optical receiver module. The optical interconnection block of the optical transmitter module and the optical interconnection block of the optical receiver module are connected to the optical waveguide of the optical PCB through guide pins.

The light emitting element may be a bottom-surface light emitting element, the bottom-surface light emitting element and the driver integrated circuit may be electrically connected to each other through wire bonding, and the driver integrated circuit and the module PCB may be electrically connected to each other through wire bonding. The light receiving element may be a bottom-surface light receiving element, the bottom-surface light receiving element and the receiver integrated circuit may be electrically connected to each other through wire bonding, and the receiver integrated circuit and the module PCB may be electrically connected to each other through wire bonding. The driver integrated circuit and the receiver integrated circuit may have bumps provided thereon. The light emitting element may be a bottom-surface light emitting element, the bottom-surface light emitting element and the module PCB may be electrically connected to each other through wire bonding, and the driver integrated circuit may be packaged on the module PCB through the bumps by flip-chip bonding. The light receiving element may be a bottom-surface light receiving element, the bottom-surface light receiving element and the module PCB may be electrically connected to each other through wire bonding, and the receiver integrated circuit may be packaged on the module PCB through the bumps by flip-chip bonding.

According to still another aspect of the present invention, an optical interconnection system includes an optical transmitter module that includes a transmitter-unit optical interconnection block for bending an optical path by a predetermined angle, a light emitting element formed in-line with an optical waveguide of the optical interconnection block through a first guide pin, a driver integrated circuit connected to the light emitting element, and a transmitter-unit flexible module PCB having the driver integrated circuit formed on an upper surface thereof; an optical receiver module that includes a receiver-unit optical interconnection block for bending an optical path by a predetermined angle, a light receiving element formed in-line with an optical waveguide of the optical interconnection block through a first guide pin, a receiver integrated circuit connected to the light receiving element, and a receiver-unit flexible module PCB having the receiver integrated circuit formed on an upper surface thereof; and an optical PCB that includes an optical waveguide connecting the optical interconnection block of the optical transmitter module and the optical interconnection block of the optical receiver block. Each of the flexible module PCBs has a guide hole through which the first guide pin passes, and the optical interconnection blocks of the optical transmitter module and the optical receiver module are connected to the optical waveguide of the optical PCB through second guide pins.

The light emitting and receiving elements may be top-surface light emitting and receiving elements having bumps provided thereon and packaged on first surfaces of the flexible module PCBs through flip-chip bonding, and the driver integrated circuit and the receiver integrated circuit may be electrically connected to second surfaces of the flexible module PCBs through wire bonding. Alternatively, the light emitting and receiving elements may be top-surface light emitting and receiving elements having bumps provided thereon and packaged on first surfaces of the flexible module PCBs through flip-chip bonding, and the driver integrated circuit and the receiver integrated circuit having bumps provided thereon may be packaged on second surfaces of the flexible module PCBs through flip-chip bonding. Alternatively, the light emitting and receiving elements may be bottom-surface light emitting and receiving elements having bumps provided thereon and packaged under first surfaces of the flexible module PCBs through flip-chip bonding, and the driver integrated circuit and the receiver integrated circuit may be electrically connected to second surfaces of the flexible module PCBs through wire bonding. Alternatively, the light emitting and receiving elements may be bottom-surface light emitting and receiving elements having bumps provided thereon and packaged under first surfaces of the flexible module PCBs through flip-chip bonding, and the driver integrated circuit and the receiver integrated circuit having bumps provided thereon may be packaged on second surfaces of the flexible module PCBs through flip-chip bonding.

According to yet another aspect of the present invention, an optical interconnection system includes an optical transmitter module that includes a transmitter-unit optical interconnection block for bending an optical path by a predetermined angle, a light emitting element formed in-line with an optical waveguide of the optical interconnection block, a first PCB having a groove formed therein such that light emitted from the light emitting element passes through the groove, a driver integrated circuit connected to the light emitting element, and a second PCB having the driver integrated circuit formed on an upper surface thereof; an optical receiver module that includes a receiver-unit optical interconnection block for bending an optical path by a predetermined angle, a light receiving element formed in-line with an optical waveguide of the optical interconnection block, a first PCB having a groove formed therein such that light is transmitted to the light receiving element through the groove, a receiver integrated circuit connected to the light receiving element, and a second PCB having the receiver integrated circuit formed on an upper surface thereof; and an optical PCB that includes an optical waveguide connecting the optical interconnection block of the optical transmitter module and the optical interconnection block of the optical receiver module. The optical interconnection blocks of the optical transmitter module and the optical receiver module are connected to the optical waveguide of the optical PCB through guide pins.

The light emitting element may be a bottom-surface light emitting element, the bottom-surface light emitting element may be connected to the first PCB through wire bonding, the driver integrated circuit may be connected to the second PCB through wire bonding, and the first and second PCBs may be bonded through a ball grid array so as to be electrically connected to each other. The light receiving element may be a bottom-surface light emitting element, the bottom-surface light emitting element may be connected to the first PCB through wire bonding, the receiver integrated circuit may be connected to the second PCB through wire bonding, and the first and second PCBs may be bonded through a ball grid array so as to be electrically connected to each other. Alternatively, the light emitting element may be a bottom-surface light emitting element, the bottom-surface light emitting element may be connected to the first PCB through wire bonding, the driver integrated circuit having bumps provided thereon may be packaged on the second PCB through flip-chip bonding, and the first and second PCBs may be bonded through a ball grid array so as to be electrically connected to each other. The light receiving element may be a bottom-surface light emitting element, the bottom-surface light emitting element may be connected to the first PCB through wire bonding, the receiver integrated circuit having bumps provided thereon may be packaged on the second PCB through flip-chip bonding, and the first and second PCBs may be bonded through a ball grid array so as to be electrically connected to each other.

The optical waveguide of the optical PCB may be formed by integrating an optical fiber, polymer waveguide, or ribbon-type fiber in the optical PCB.

Advantageous Effects

According to the present invention, since the optical PCB is manufactured by integrating the integrated optical waveguide in a PCB, it is possible to minimize optical loss occurring in a free space which is inevitably provided in the conventional optical interconnection system. Since a guide pin is not used for optical alignment between the optical elements, optical loss caused by a change in optical alignment due to environmental factors such as vibration or temperature change does not occur. Since a separate PCB is not used, the optical elements can be packaged more compactly.

Further, since the light emitting or receiving element is directly packaged on the optical interconnection block, the optical transmitter or receiver module does not have a free space provided between the light emitting or receiving element and the optical interconnection block or has a small free space provided there between. Therefore, optical loss is small. Further, since the chemical adhesion is performed without using a guide pin, the optical interconnection system can stably operate for a long time with no variation in alignment caused by vibration or environmental changes during operation.

DESCRIPTION OF DRAWINGS

FIG. 5 is a schematic cross-sectional view of an optical interconnection system using an optical PCB according to a first example embodiment of the present invention.

FIG. 6 is a schematic cross-sectional view of an optical interconnection system using an optical PCB according to a second example embodiment of the present invention.

FIG. 7 is a schematic cross-sectional view of an optical interconnection system using an optical PCB according to a third example embodiment of the present invention.

FIG. 21 is a schematic cross-sectional view of an optical interconnection system using an optical PCB according to an eighth example embodiment of the present invention.

FIG. 22 is a schematic cross-sectional view of an optical interconnection module of the optical interconnection system of FIG. 21.

FIG. 23 is a schematic cross-sectional view of an optical interconnection system using an optical PCB according to a ninth example embodiment of the present invention.

FIG. 28 is a schematic cross-sectional view of an optical interconnection module of the optical interconnection system of FIG. 27.

MODE OF THE INVENTION

Hereinafter, exemplary embodiments of the present invention will be described in detail with reference to the accompanying drawings. When describing in detail a structure or function that is not central to the present invention would likely detract from the clarity and concision of this disclosure, the structure or function will not be described in detail.

Figure 1:
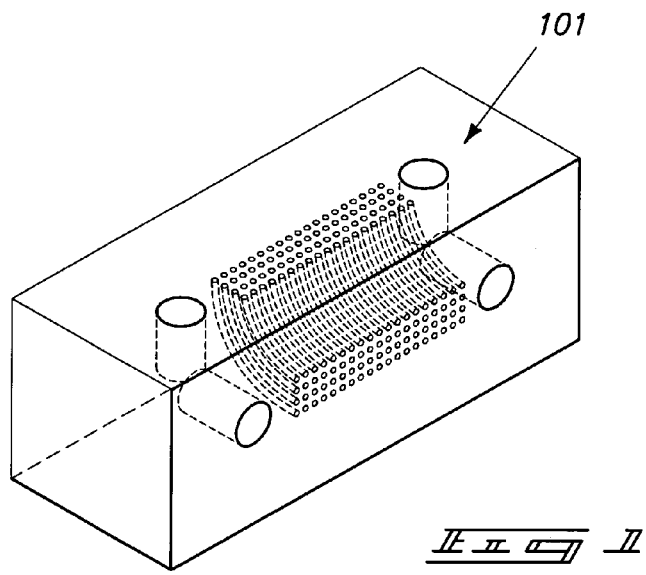
FIG. 1 is a schematic perspective view of conventional optical interconnection block.
Figure 2:
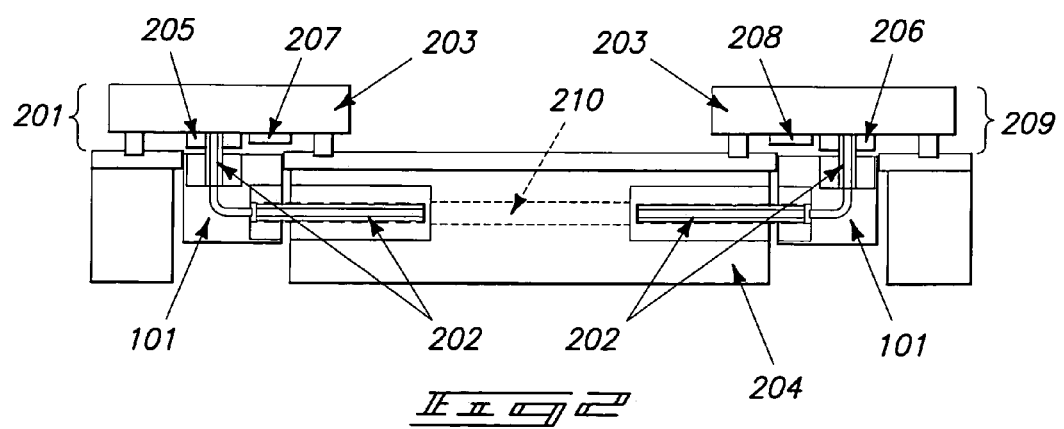
FIG. 2 is a schematic cross-sectional view of a conventional optical interconnection system in which optical modules are connected through an optical fiber.
Figure 3:
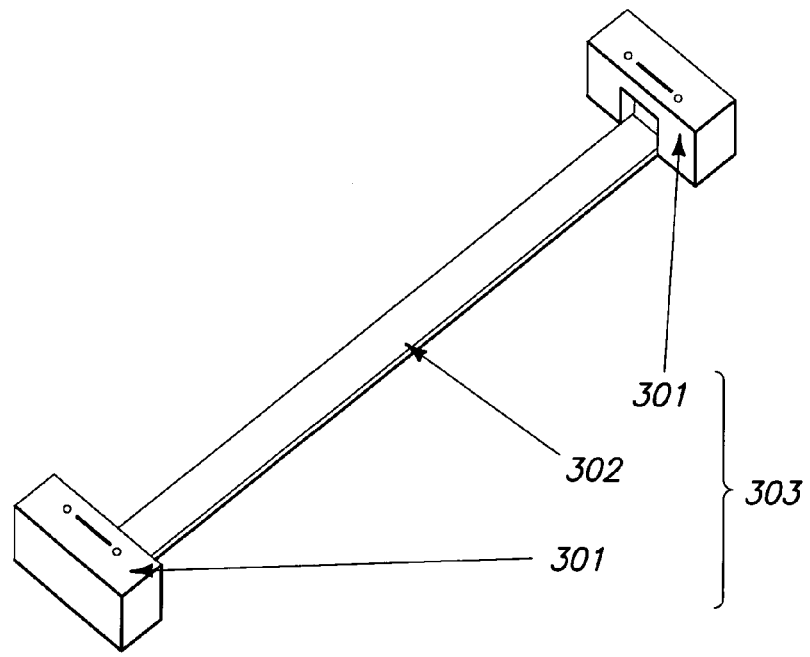
FIG. 3 is a schematic perspective view of an one-unit optical waveguide according to the present invention.
Figure 4:
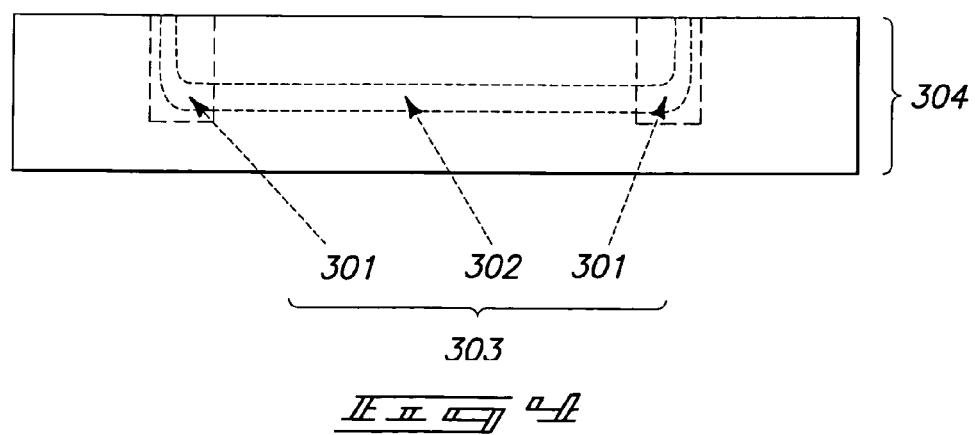
FIG. 4 is a schematic cross-sectional view of an optical PCB manufactured by integrating the one-unit optical waveguide of FIG. 3 therein.

FIG. 3 is a schematic perspective view of an one-unit optical waveguide according to the present invention. FIG. 4 is a schematic cross-sectional view of an optical PCB manufactured by integrating the one-unit optical waveguide of FIG. 3 therein.

Referring to FIGS. 3 and 4, the one-unit optical waveguide 303 includes a transmitter-unit optical interconnection block 301, a receiver-unit optical interconnection block 301, and an optical fiber 302 which is inserted and connected to each of the optical interconnection blocks 301. The optical interconnection blocks 301 are provided to bend an optical path by a predetermined angle, for example, substantially 90 degrees. Meanwhile, the one-unit optical waveguide 303 may be formed by replacing the optical fiber 302 with a polymer waveguide or ribbon-type fiber.

In a process of manufacturing an optical PCB 304, the one-unit optical waveguide 303 is integrated in a lamination and then pressurized, thereby manufacturing an optical PCB 304 having the optical waveguide 303 integrated therein. Alternatively, only the optical fiber 302, a polymer waveguide, or a ribbon-type fiber may be integrated and then pressurized, thereby manufacturing an optical PCB 304 having the one-unit optical waveguide 303 integrated therein.

Further, as shown in FIG. 4, the optical waveguide 303 may be integrated in the optical PCB 304 such that the upper surface of the optical interconnection block 301 of the optical waveguide 303 is aligned with the upper surface of the optical PCB 304, and then pressurized in order to manufacture the optical PCB. In this case, when the optical PCB 304 is thicker than the optical interconnection block 301 which is to be laminated, a separate copper plate may be laminated in the optical PCB 304, and the one-unit optical waveguide 303 may be built and integrated on the copper plate such that the upper surface of the optical interconnection block 301 is exposed to the upper surface of the optical PCB 304.

Therefore, in the optical PCB 304 having the optical waveguide 303 integrated therein according to this example embodiment, manual connection between the optical interconnection blocks and the optical PCB through a guide pin is not necessary. Further, since the optical interconnection blocks 301 are laminated in the optical PCB 304, a probability of optical loss or deformation in the optical waveguide 303 caused by environmental factors such as vibration or heat is significantly reduced. Therefore, the optical PCB 304 can stably operate.

FIG. 5 is a schematic cross-sectional view of an optical interconnection system using an optical PCB according to a first example embodiment of the present invention.

Referring to FIG. 5, the optical interconnection system 411 according to the first example embodiment of the present invention includes an optical PCB 304 having an one-unit optical waveguide integrated therein, a bottom-surface light emitting element 401, a bottom-surface light receiving element 402, a driver integrated circuit 403, and a receiver integrated circuit 404. The bottom-surface light emitting element and bottom-surface light receiving element refer to optical elements that emit/receive light at an opposite surface to a surface where a pattern is formed. This definition applies throughout this disclosure.

The optical PCB 304 includes an one-unit optical waveguide 303 having the optical interconnection blocks 301 laminated in the optical PCB 304 and an optical fiber 302 inserted and connected to each of the optical interconnection blocks 301.

The bottom-surface light emitting element 401, the bottom-surface light receiving element 402, the driver integrated circuit 403, and the receiver integrated circuit 404 are mounted on the optical PCB 304. For example, the bottom-surface light emitting element 401 and the driver integrated circuit 403, the bottom-surface light receiving element 402 and the receiver integrated circuit 404, and the optical PCB 304 and the driver and receiver integrated circuits 403 and 404, are electrically connected through bonding wires 405 and 406 and then packaged. The bottom-surface light emitting element 401 and the bottom-surface light receiving element 402 may be formed in-line with optical waveguide arrays of the optical interconnection blocks 301.

According to the first example embodiment, since a guide pin is not used for optical alignment, it is possible to implement a simpler and more compact optical interconnection system 411. Further, since a separate PCB is not used, the space of the optical interconnection system can be efficiently used. Further, since the optical interconnection blocks 301 are integrated with the optical waveguide 302 so as to be laminated in the optical PCB 304, a guide pin does not need to be used and the optical PCB 304 can stably operate for a long time without being affected by external shock. Furthermore, since there is no free space in the arrangement portion between the optical elements, it is possible to achieve higher optical efficiency.

FIG. 6 is a schematic cross-sectional view of an optical interconnection system using an optical PCB according to a second example embodiment of the present invention.

Referring to FIG. 6, the optical interconnection system 412 according to the second example embodiment of the present invention includes an optical PCB 304 having an one-unit optical waveguide 303 integrated therein, an top-surface light emitting element 407, an top-surface light receiving element 408, a driver integrated circuit 409, and a receiver integrated circuit 410. The top-surface light emitting element and top-surface light receiving element refer to optical elements which emit/receive light at a surface where a pattern is formed. This definition applies throughout this disclosure.

The one-unit optical waveguide 303 includes a pair of optical interconnection blocks 301 and an optical waveguide 302 formed of optical fiber inserted and connected to each of the optical interconnection blocks 301.

The top-surface light emitting element 407, the top-surface light receiving element 408, the driver integrated circuit 409, and the receiver integrated circuit 410 have bumps provided on bottom surfaces thereof which come in contact with the optical PCB 304. The top-surface light emitting element 407, the top-surface light receiving element 408, the driver integrated circuit 409, and the receiver integrated circuit 410 are packaged on the upper surface of the optical PCB 304 through flip-chip bonding.

As the bumps are provided on the respective optical elements 407 to 410, it is possible to reduce noise and to manufacture a simple and stable optical interconnection system 412 making efficient use of space.

Figure 8:
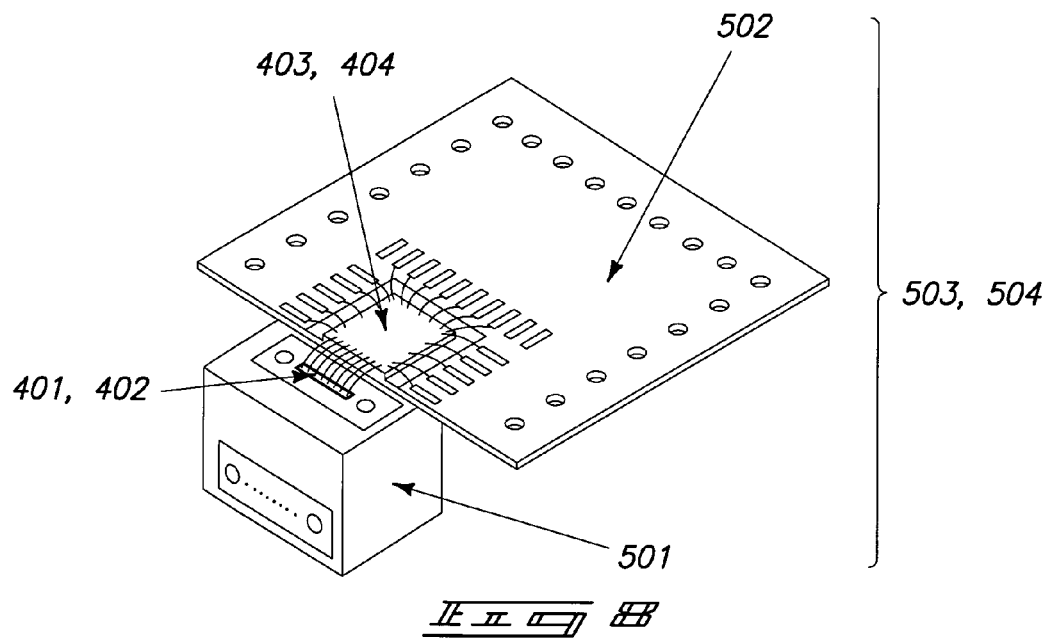
FIG. 8 is a perspective view of an optical interconnection module of the optical interconnection system of FIG. 7.
Figure 9:
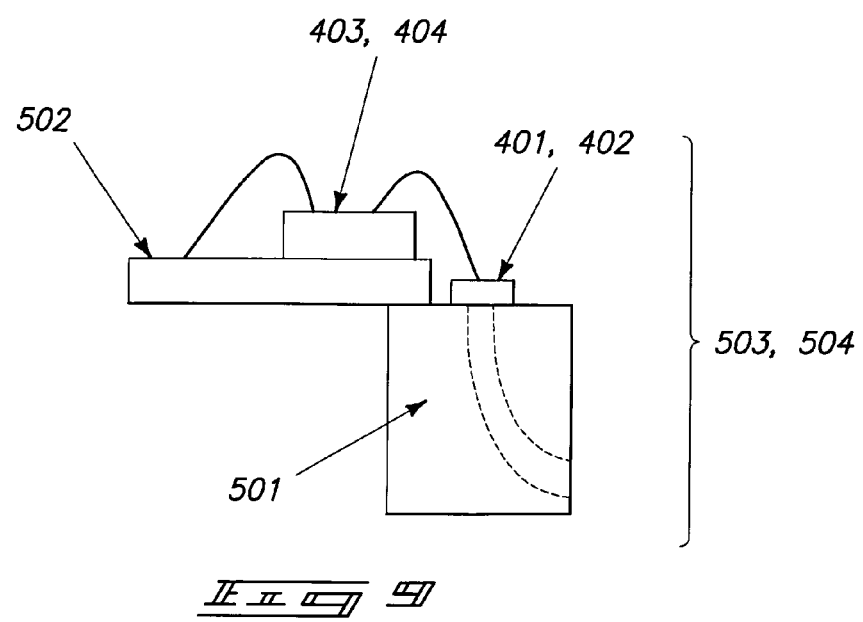
FIG. 9 is a schematic cross-sectional view of the optical interconnection module of FIG. 8.

FIG. 7 is a schematic cross-sectional view of an optical interconnection system using an optical PCB according to a third example embodiment of the present invention. FIG. 8 is a perspective view of an optical interconnection module of the optical interconnection system of FIG. 7. FIG. 9 is a schematic cross-sectional view of the optical interconnection module of FIG. 8.

Referring to FIGS. 7 to 9, the optical interconnection system 505 according to the third example embodiment of the present invention includes an optical transmitter module 503, an optical receiver module 504, and an optical PCB 204.

Specifically, the optical transmitter module 503 includes an optical interconnection block 501, a bottom-surface light emitting element 401 arranged on the optical interconnection block 501, a module PCB 502, and a driver integrated circuit 403 directly bonded to the upper surface of the module PCB 502. The bottom-surface light emitting element 401 and the driver integrated circuit 403 are electrically connected to each other through wire bonding, and the driver integrated circuit 403 and the module PCB 502 are electrically connected to each other through wire bonding.

The optical receiver module 504 includes an optical interconnection block 502, a bottom-surface light receiving element 402 arranged on the optical interconnection block 502, a module PCB 502, and a receiver integrated circuit 404 directly bonded to the upper surface of the module PCB 502. The bottom-surface light receiving element 402 and the receiver integrated circuit 404 are electrically connected to each other through wire bonding, and the receiver integrated circuit 404 and the module PCB 502 are electrically connected to each other through wire bonding.

The optical transmitter module 503 and the optical receiver module 504 are each connected to the optical waveguide 210 of the optical PCB through guide pins 420.

Meanwhile, the optical interconnection system 505 according to this example embodiment can be manufactured by the following process.

First, the optical waveguide 210 is integrated in a PCB so as to form the optical PCB 204. Thereafter, a groove having a size of 1 cm×1 cm is formed in a portion of the optical PCB 204 corresponding to either end of the waveguide 210. Then, the cross-section of the optical waveguide 210 is exposed through the groove formed in the optical PCB 204. The cross-section of the optical waveguide 210 is ground and a guide pin hole is formed in order to prepare the optical PCB 204. Then, as shown in the drawing, the optical waveguide 210 and the optical transmitter and receiver modules 503 and 504 are connected through the guide pins 420 and then arranged.

According to this example embodiment, optical loss is significantly reduced compared to the structure in which an optical PCB is implemented using a guide pin. Further, since a guide pin is not used between the bottom-surface light emitting or receiving element 401 or 402 and the optical interconnection block 501, the optical PCB can stably operate without being affected by the external environment.

Figure 10:
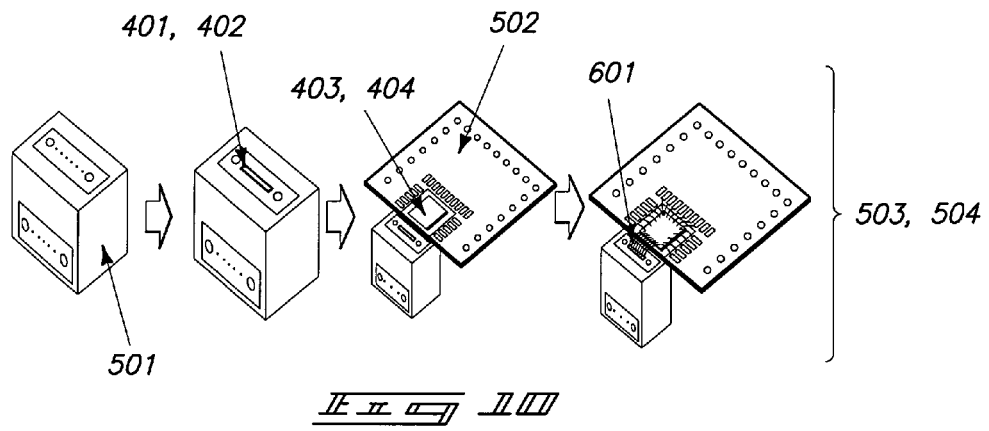
FIG. 10 is a diagram showing a process of manufacturing the optical transmitter and receiver modules of the optical interconnection system of FIG. 7.

FIG. 10 is a diagram showing a process of manufacturing the optical transmitter and receiver modules of the optical interconnection system of FIG. 7.

First, a transparent chemical adhesive is applied to a portion of the upper surface of the optical interconnection block 501 where the optical waveguide array is exposed.

Then, the bottom-surface light emitting or receiving element 401 or 402 is accurately arranged and bonded on the upper surface of the optical interconnection block 501 where the chemical adhesive is applied.

Then, the driver integrated circuit 403 or the receiver integrated circuit 404 is bonded to an upper surface of the module PCB 502 and then electrically connected to the module PCB 502 through wire bonding.

Finally, the module PCBs 502 having the driver integrated circuit 403 and the receiver integrated circuit 404 packaged thereon are bonded to the optical interconnection blocks 501, respectively. Then, the driver integrated circuit 403 and the bottom-surface light emitting element 401 are connected to each other through a bonding wire 601, and the receiver integrated circuit 404 and the bottom-surface light receiving element 402 are connected to each other through a bonding wire 601.

Figure 11:
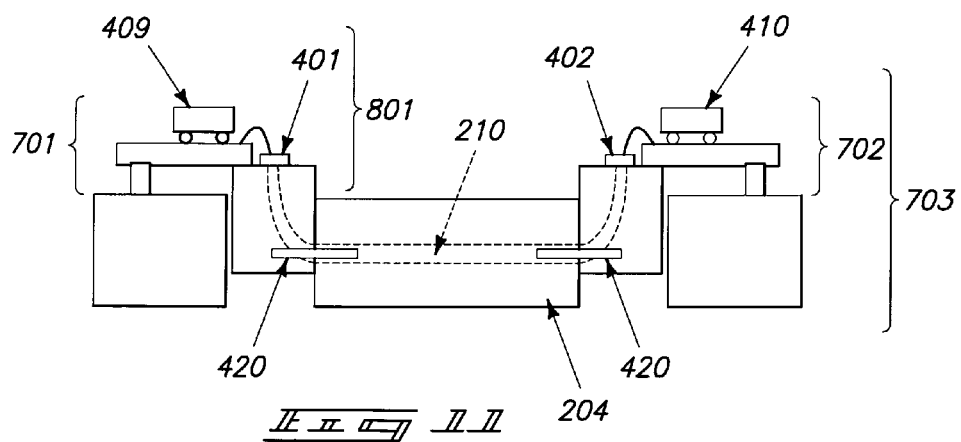
FIG. 11 is a schematic cross-sectional view of an optical interconnection system using an optical PCB according to a fourth example embodiment of the present invention.
Figure 12:
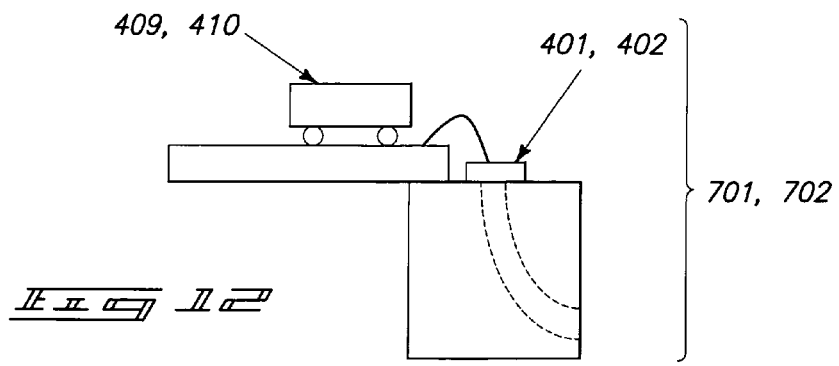
FIG. 12 is a cross-sectional view of an optical interconnection module of FIG. 11.

FIG. 11 is a schematic cross-sectional view of an optical interconnection system using an optical PCB according to a fourth example embodiment of the present invention. FIG. 12 is a cross-sectional view of an optical interconnection module of FIG. 11.

Referring to FIGS. 11 and 12, the optical interconnection system 703 according to the fourth example embodiment of the present invention includes an optical transmitter module 701, an optical receiver module 702, and an optical PCB 204.

The optical transmitter module 701 includes a transmitter-unit optical interconnection block for bending an optical path by a predetermined angle, for example, 90 degrees, a bottom-surface light emitting element 401 which is formed in-line with an optical waveguide of the optical interconnection block, a driver integrated circuit 409 connected to the bottom-surface light emitting element 401, and a module PCB having the driver integrated circuit 409 formed thereon. The bottom-surface light emitting element 401 and the module PCB are electrically connected to each other through wire bonding, and the driver integrated circuit 409 having bumps provided on the bottom surface thereof is formed on the module PCB through flip-chip bonding.

The optical receiver module 702 includes a receiver-unit optical interconnection block for bending an optical path by a predetermined angle, for example, 90 degrees, a bottom-surface light receiving element 402 which is formed in-line with an optical waveguide of the optical interconnection block, a receiver integrated circuit 410 connected to the bottom-surface light receiving element 402, and a module PCB having the receiver integrated circuit 410 formed thereon. The bottom-surface light receiving element 402 and the module PCB are electrically connected to each other through wire bonding, and the receiver integrated circuit 410 having bumps provided on the bottom surface thereof is formed on the module PCB through flip-chip bonding.

The optical PCB 204 includes an optical waveguide 210 integrated therein, and the optical transmitter and receiver modules 701 and 702 are each connected to the optical waveguide 210 of the optical PCB 204 through guide pins 420.

Figure 13:
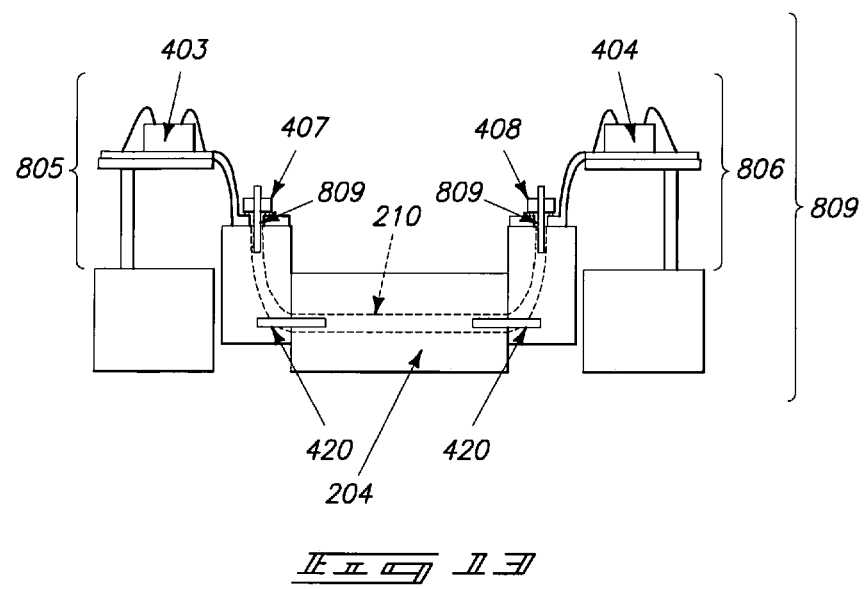
FIG. 13 is a schematic cross-sectional view of an optical interconnection system using an optical PCB according to a fifth example embodiment of the present invention.
Figure 14:
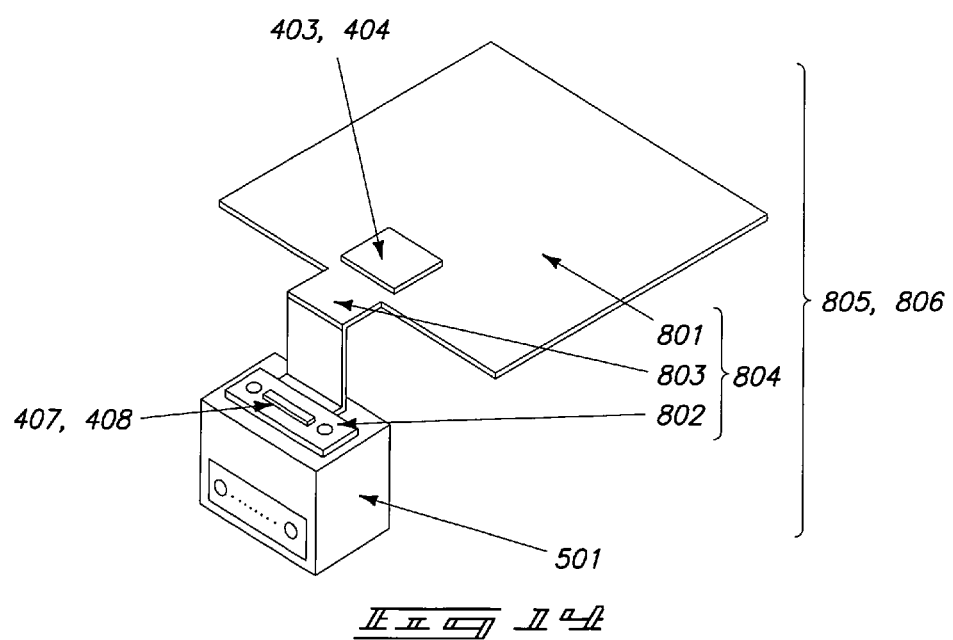
FIG. 14 is a perspective view of an optical interconnection module of the optical interconnection system of FIG. 13.
Figure 15:
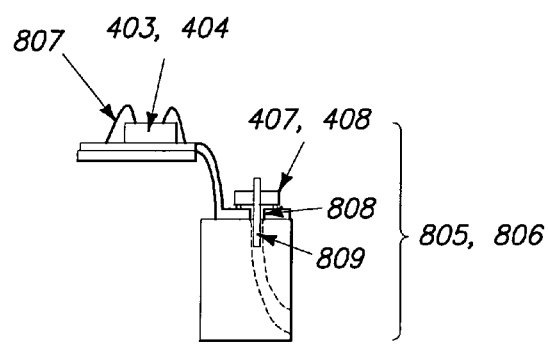
FIG. 15 is a schematic cross-sectional view of the optical interconnection module of FIG. 14.

FIG. 13 is a schematic cross-sectional view of an optical interconnection system using an optical PCB according to a fifth example embodiment of the present invention. FIG. 14 is a perspective view of an optical interconnection module of the optical interconnection system of FIG. 13. FIG. 15 is a schematic cross-sectional view of the optical interconnection module of FIG. 14.

Referring to FIGS. 13 to 15, the optical interconnection system 809 according to the fifth example embodiment of the present invention includes an optical transmitter module 805, an optical receiver module 806, and an optical PCB 204.

The optical transmitter and receiver modules 805 and 806 respectively include an optical interconnection block 501 and a flexible module PCB 804.

Specifically, the optical transmitter module 805 includes a transmitter-unit optical interconnection block 501 for bending an optical path by a predetermined angle, for example, 90 degrees, an top-surface light emitting element 407 which is formed in-line with an optical waveguide of the optical interconnection block 501 through a first guide pin 809, a driver integrated circuit 403 connected to the top-surface light emitting element 407, and a transmitter-unit flexible module PCB 804 having the driver integrated circuit 403 formed thereon.

The optical receiver module 806 includes a receiver-unit optical interconnection block 502 for bending an optical path by a predetermined angle, for example, 90 degrees, an top-surface light receiving element 408 which is formed in-line with an optical waveguide of the optical interconnection block 501 through a first guide pin 809, a receiver integrated circuit 404 connected to the top-surface light receiving element 408, and a receiver-unit flexible module PCB 804 having the receiver integrated circuit 404 formed thereon. Meanwhile, each of the flexible module PCBs 804 includes a guide hole 808 through which the first guide pin 809 passes.

The optical transmitter and receiver modules 805 and 806 are each connected to the optical waveguide 210 of the optical PCB 204 through second guide pins 420.

The driver integrated circuit 403 or the receiver integrated circuit 404 is bonded to a first surface of the flexible module PCB 804, that is, a wide surface 801, and then electrically connected to the flexible module PCB 804 through wire bonding.

A small guide hole 808 is formed on a narrow surface 802 of the flexible module PCB 804 such that light can pass through the guide hole 808, and the top-surface light emitting or receiving element 407 or 408 having bumps provided on the bottom surface thereof is packaged on the narrow surface 802 through flip-chip bonding. Then, the top-surface light emitting or receiving element 407 or 408 is arranged on the optical interconnection block 501 through the first guide pin 809.

The wide surface 801 and the narrow surface 802 of the flexible module PCB 804 are connected to each other through an interconnection PCB 803 having wire lines formed thereon. Meanwhile, if necessary, the wide surface 801 and the narrow surface 802 of the flexible module PCB 804 may be connected to each other through a rigid plate such that flexibility is not provided between the wide surface 801 and the narrow surface 802.

Figure 16:
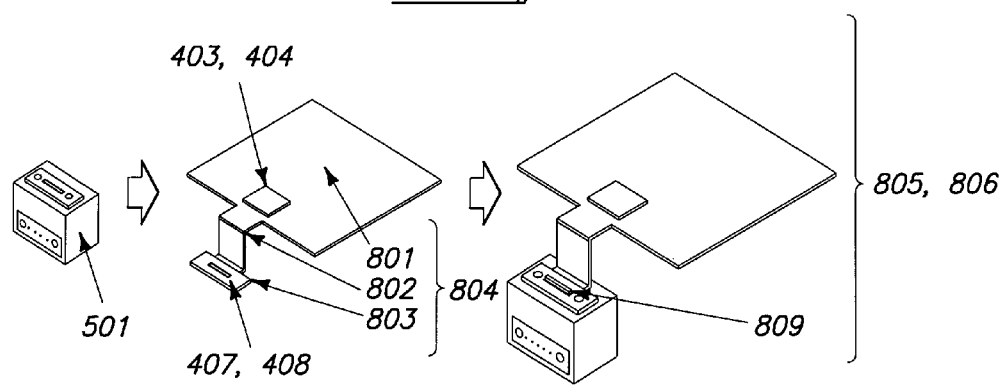
FIG. 16 is a diagram showing a process of manufacturing the optical transmitter and receiver modules of the optical interconnection system of FIG. 13.

FIG. 16 is a diagram showing a process of, manufacturing the optical transmitter and receiver modules of the optical interconnection system of FIG. 13.

Referring to FIG. 16, the process of manufacturing the optical transmitter and receiver modules of the optical interconnection system according to this example embodiment will be described as follows.

First, the driver integrated circuit 403 or the receiver integrated circuit 404 is bonded to the wide surface 801 of the flexible module PCB 804 and electrically connected to the flexible module PCB 804 through wire bonding.

Then, a hole is formed on the narrow surface 802 of the flexible module PCB 804 such that light can pass through the hole, and the top-surface light emitting or receiving element 407 or 408 having bumps provided on the bottom surface thereof is packaged on the narrow surface 802 through flip-chip bonding.

Finally, the flexible module PCB 804 is arranged and bonded on the optical interconnection block 501 through the first guide pin 809.

Figure 17:
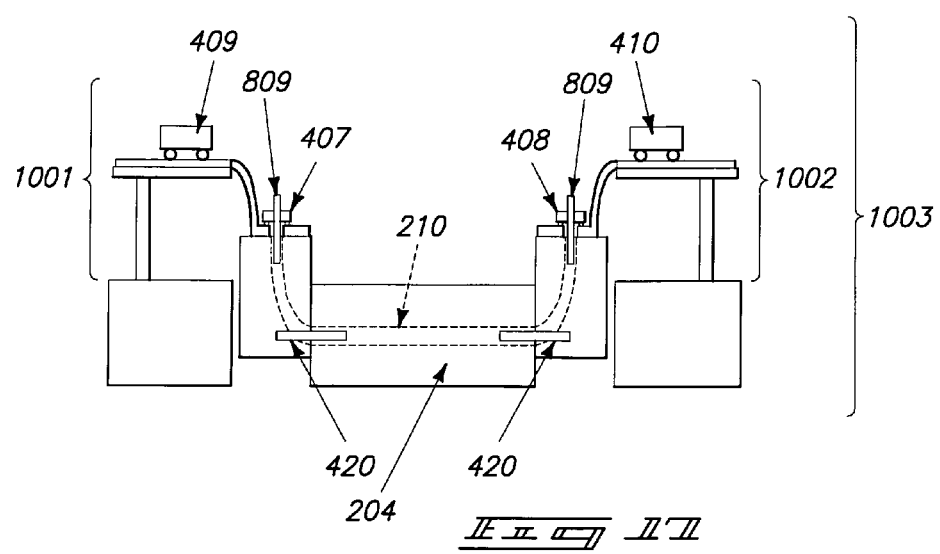
FIG. 17 is a schematic cross-sectional view of an optical interconnection system using an optical PCB according to a sixth example embodiment of the present invention.
Figure 18:
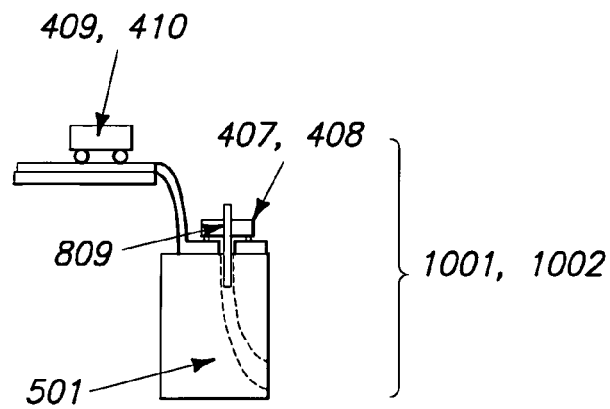
FIG. 18 is a schematic cross-sectional view of an optical interconnection module of the optical interconnection system of FIG. 0A.

FIG. 17 is a schematic cross-sectional view of an optical interconnection system using an optical PCB according to a sixth example embodiment of the present, invention. FIG. 18 is a schematic cross-sectional view of an optical interconnection module of the optical interconnection system of FIG. 17.

Referring to FIGS. 17 and 18, the optical interconnection system 1003 according to the sixth example embodiment of the present invention includes an optical transmitter module 1001, an optical receiver module 1002, and an optical PCB 204.

The optical transmitter module 1001 includes a transmitter-unit optical interconnection block 501 for bending an optical path by a predetermined angle, for example, 90 degrees, an top-surface light emitting element 407 which is formed in-line with an optical waveguide of the optical interconnection block 501 through a first guide pin 809, a driver integrated circuit 409 connected to the top-surface light emitting element 407, and a transmitter-unit flexible module PCB having the driver integrated circuit 409 formed thereon.

The optical receiver module 1002 includes a receiver-unit optical interconnection block 501 for bending an optical path by a predetermined angle, for example, 90 degrees, an top-surface light emitting element 408 which is formed in-line with the optical waveguide of the optical interconnection block 501 through a first guide pin 809, a receiver integrated circuit 410 connected to the top-surface light receiving element 408, and a receiver-unit flexible module PCB having the receiver integrated circuit 410 formed thereon. Meanwhile, the respective flexible module PCBs have a guide hole formed therein, through which the first guide pin 809 passes.

The optical waveguide 210 of the optical PCB 204 is connected to the light transmitter and receiver modules 1001 and 1002 through second guide pins 420.

The driver integrated circuit 409 or the receiver integrated circuit 410 having bumps provided on the bottom surface thereof is bonded to a wide surface of the flexible module PCB. That is, the driver integrated circuit 409 or the receiver integrated circuit 410 is packaged on the wide surface through flip-chip bonding so as to be electrically connected to the flexible module PCB.

A guide hole is formed on a narrow surface of the flexible module PCB such that light can pass through the guide hole. The top-surface light emitting or receiving element 407 or 408 having bumps provided on the bottom surface thereof is packaged on the narrow surface through flip-chip bonding and then arranged on the optical interconnection block 501 through the first guide pin 809.

Figure 19:
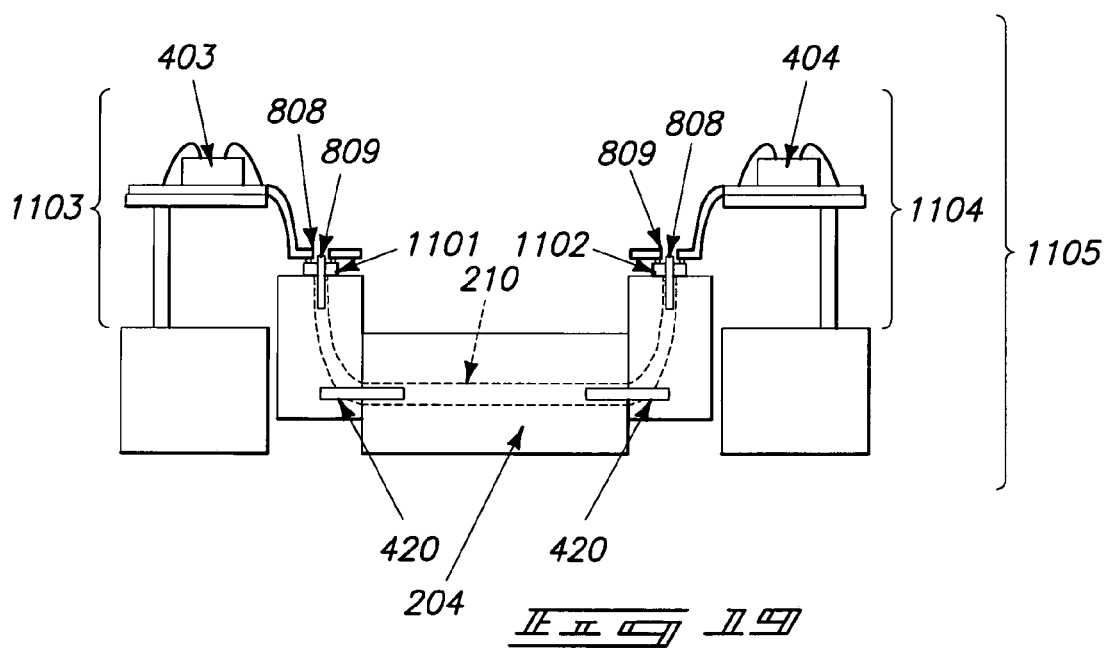
FIG. 19 is a schematic cross-sectional view of an optical interconnection system using an optical PCB according to a seventh example embodiment of the present invention.
Figure 20:
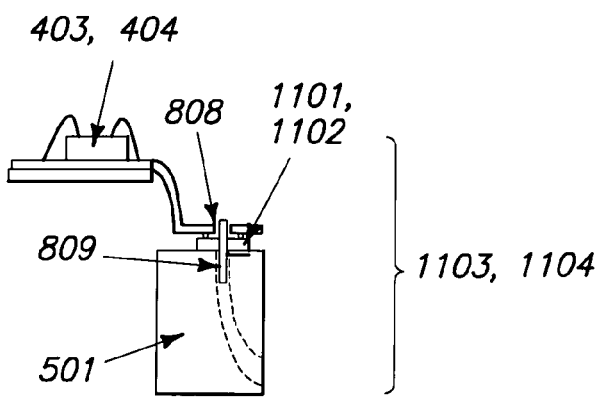
FIG. 20 is a schematic cross-sectional view of an optical interconnection module of the optical interconnection system of FIG. 19.

FIG. 19 is a schematic cross-sectional view of an optical interconnection system using an optical PCB according to a seventh example embodiment of the present invention. FIG. 20 is a schematic cross-sectional view of an optical interconnection module of the optical interconnection system of FIG. 19.

Referring to FIGS. 19 and 20, the optical interconnection system 1105 according to the seventh example embodiment of the present invention includes an optical transmitter module 1103, an optical receiver module 1104, and an optical PCB 204.

The optical transmitter module 1103 includes a bottom-surface light emitting element 1101 having bumps formed on the upper surface thereof, a driver integrated circuit 403, and a flexible module PCB. The bottom-surface light emitting element 1101 is packaged through flip-chip bonding so as to be formed under a narrow surface of the flexible module PCB, and the driver integrated circuit 403 is electrically connected to a wide surface of the flexible module PCB through wire bonding.

The optical receiver module 1104 includes a bottom-surface light receiving element 1102 having bumps provided thereon, a receiver integrated circuit 404, and a flexible module PCB. The bottom-surface light emitting element 1102 is packaged through flip-chip bonding so as to be formed under a narrow surface of the flexible module PCB, and the receiver integrated circuit 404 is electrically connected to a wire surface of the flexible module PCB through wire bonding.

A guide hole 808 is formed on the narrow surface of each of the flexible module PCBs such that light can pass through the guide hole 808, and the bottom-surface light emitting or receiving element 1101 or 1102 is arranged in line with the optical waveguide of the optical interconnection block 501 through the first guide pin 809.

The optical transmitter and receiver modules 1103 and 1104 are each connected to the optical waveguide of the optical PCB 204 through second guide pins 420.

FIG. 21 is a schematic cross-sectional view of an optical interconnection system using an optical PCB according to an eighth example embodiment of the present invention. FIG. 22 is a schematic cross-sectional view of an optical interconnection module of the optical interconnection system of FIG. 21.

Referring to FIGS. 21 and 22, the optical interconnection system 1203 according to the eighth example embodiment of the present invention includes an optical transmitter module 1201, an optical receiver module 1202, and an optical PCB 204.

The optical transmitter module 1201 includes a bottom-surface light emitting element 1101 having bumps on the upper surface thereof, a driver integrated circuit 409 having bumps provided on the bottom surface thereof, and a flexible module PCB 804. The bottom-surface light emitting element 1101 is packaged through flip-chip bonding so as to be formed under a narrow surface 802 of the flexible module PCB 804, and the driver integrated circuit 409 is packaged through flip-chip bonding so as to be electrically connected to a wide surface 801 of the flexible module PCB 804.

The optical receiver module 1202 includes a bottom-surface light receiving element 1102 having bumps provided on the upper surface thereof, a receiver integrated circuit having bumps provided on the bottom surface thereof, and a flexible module PCB 804. The bottom-surface light receiving element 1102 is packaged through flip-chip bonding so as to be formed under a narrow surface 802 of the flexible module PCB 804, and the receiver integrated circuit 410 is packaged through flip-chip bonding so as to be electrically connected to a wide surface 801 of the flexible module PCB 804.

A guide hole is formed on the narrow surface 802 of each of the flexible module PCBs 804 such that light can pass through the guide hole, and the bottom-surface light emitting or receiving element 1101 or 1102 is arranged in line with an optical waveguide of the optical interconnection block 501 through a first guide pin 809. The optical transmitter and receiver modules 1201 and 1202 are connected to the optical waveguide 210 of the optical PCB 204 through second guide pins 420.

Figure 24:
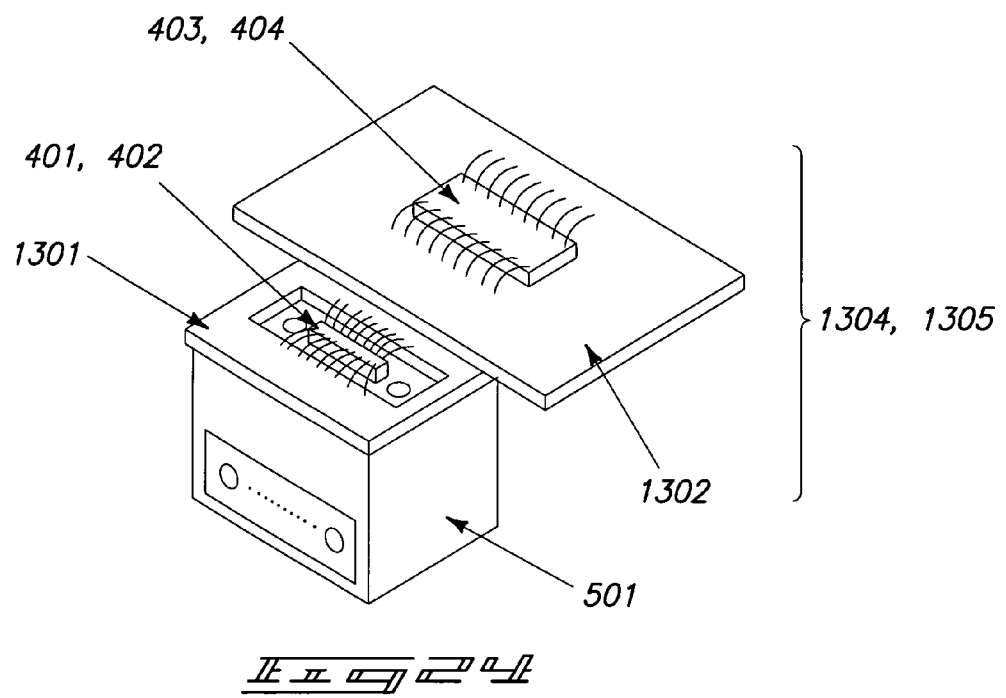
FIG. 24 is a perspective view of an optical interconnection module of the optical interconnection system of FIG. 23.
Figure 25:
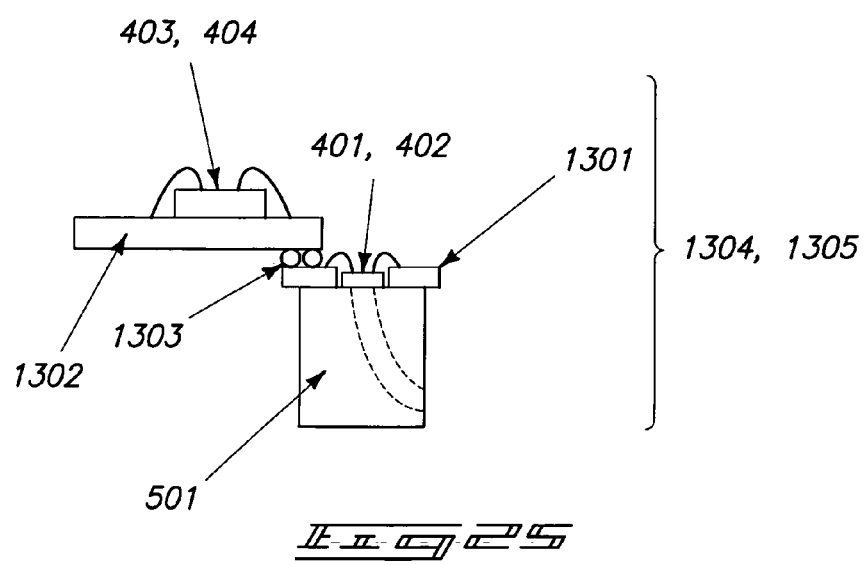
FIG. 25 is a schematic cross-sectional view of the optical interconnection module of FIG. 24.

FIG. 23 is a schematic cross-sectional view of an optical interconnection system using an optical PCB according to a ninth example embodiment of the present invention. FIG. 24 is a perspective view of an optical interconnection module of the optical interconnection system of FIG. 23. FIG. 25 is a schematic cross-sectional view of the optical interconnection module of FIG. 24.

Referring to FIGS. 23 to 25, the optical interconnection system 1306 according to the ninth example embodiment of the present invention includes an optical transmitter module 1304, an optical receiver module 1305, and an optical PCB 204.

The optical transmitter module 1304 includes an optical interconnection block 501, a bottom-surface light emitting element 401, a small PCB 1301 having a groove formed therein such that light can pass through the groove, a driver integrated circuit 403, and a module PCB 1302 having the driver integrated circuit 403 packaged thereon through wire bonding. The bottom-surface light emitting element 401 arranged on the optical interconnection block 501 is electrically connected to the small PCB 1301 through wire bonding, and the module PCB 1302 is bonded to the small PCB 1301 attached to the optical interconnection block 501 through a ball grid array 1303 so as to be electrically connected to the small PCB 1301.

The optical receiver module 1305 includes an optical interconnection block 501, a bottom-surface light receiving element 402, a small PCB 1301 having a groove formed therein such that light can pass through the groove, a receiver integrated circuit 404, and a module PCB 1302 having the receiver integrated circuit 404 packaged thereon through wire bonding. The bottom-surface light receiving element 402 arranged on the optical interconnection block 501 is electrically connected to the small PCB 1301 through wire bonding, and the module PCB 1302 is bonded to the small PCB 1301 attached to the optical interconnection block 501 through a ball grid array 1303 so as to be electrically connected to the small PCB 1301.

The optical transmitter and receiver modules 1304 and 1305 are each connected to the optical waveguide of the optical PCB 204 through guide pins 420.

Figure 26:
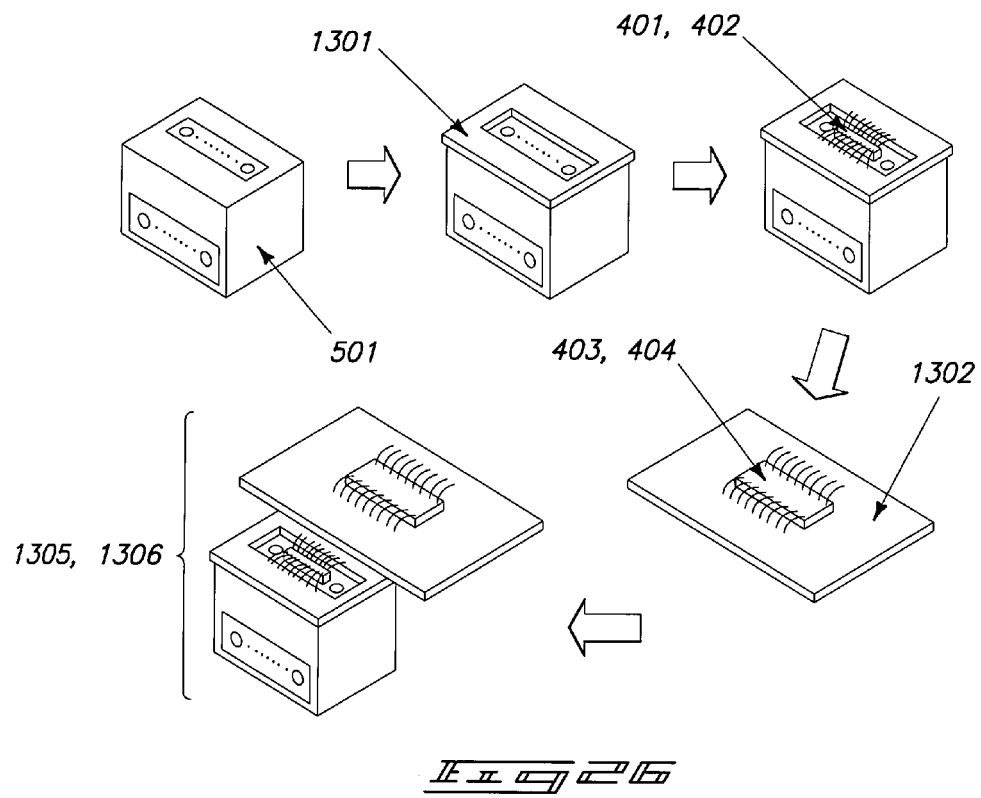
FIG. 26 is a diagram showing a process of manufacturing the optical transmitter and receiver modules of the optical interconnection system of FIG. 23.

FIG. 26 is a diagram showing a process of manufacturing the optical transmitter and receiver modules of the optical interconnection system of FIG. 23.

Referring to FIG. 26, the process of manufacturing the optical transmitter and receiver modules of the optical interconnection system according to this example embodiment will be described as follows.

First, the bottom-surface light emitting or receiving element 401 or 402 is bonded to the upper surface of the optical interconnection block 501 by a transparent chemical adhesive so as to be accurately aligned with the optical waveguide array.

Then, a groove is formed in such a manner that light can pass through the groove, and the small PCB 1301 having an electrical pattern provided thereon is bonded, to the upper surface of the optical interconnection block 501.

Then, the driver integrated circuit 403 or the receiver integrated circuit 404 is bonded to the module PCB 1302 and electrically connected to the module PCB 1302 through wire bonding.

Finally, the module PCB 1302 is bonded to the small PCB through the ball grid array so as to be electrically connected to the small PCB.

Figure 27:
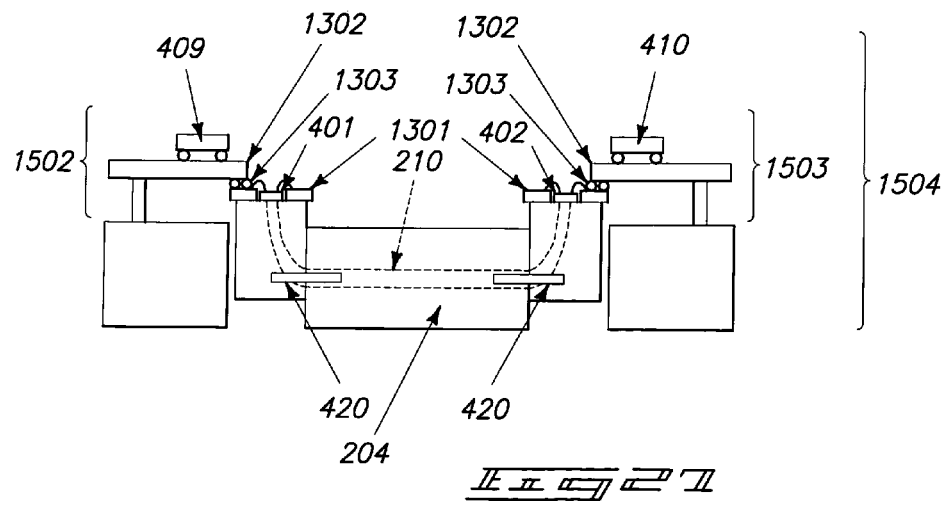
FIG. 27 is a schematic cross-sectional view of an optical interconnection system using an optical PCB according to a tenth example embodiment of the present invention.

FIG. 27 is a schematic cross-sectional view of an optical interconnection system using an optical PCB according to a tenth example embodiment of the present invention. FIG. 28 is a schematic cross-sectional view of an optical interconnection module of the optical interconnection system of FIG. 27.

Referring to FIGS. 27 and 28, the optical interconnection system 1504 according to the tenth example embodiment of the present invention includes an optical transmitter module 1502, an optical receiver module 1503, and an optical PCB 204.

The optical transmitter module 1502 includes an optical interconnection block 501, a bottom-surface light emitting element 401, a small PCB 1301 having a groove formed therein such that light can pass through the groove, a driver integrated circuit 409 having bumps provided on the bottom-surface thereof, and a module PCB 1501 having the driver integrated circuit 409 packaged thereon through flip-chip bonding. The bottom-surface light emitting element 401 arranged on the optical interconnection block 501 is electrically connected to the small PCB 1301 through wire bonding, and the module PCB 1501 is bonded to the small PCB 1301 attached to the optical interconnection block 501 through a ball grid array 1303 so as to be electrically connected to the small PCB 1301.

The optical receiver module 1503 includes an optical interconnection block 501, a bottom-surface light receiving element 402, a small PCB having a groove formed therein such that light can pass through the groove, a receiver integrated circuit 410 having bumps provided on the bottom surface thereof, a module PCB 1501 having the driver integrated circuit 409 packaged thereon. The bottom-surface light receiving element 402 arranged on the optical interconnection block 501 is electrically connected to the small PCB 1301 through wire bonding, and the module PCB 1501 of the optical receiver module 1503 is bonded to the small PCB 1301 attached to the optical interconnection block 501 through a ball grid array 1303, so as to be electrically connected to the small PCB 1301.

The optical transmitter and receiver modules 1502 and 1503 are each connected to the optical waveguide of the optical PCB 204 through guide pins 420.

While the optical interconnection system using an optical PCB having an optical waveguide integrated therein according to the present invention has been shown and described with reference to certain exemplary embodiments thereof, it will be understood by those skilled in the art that various changes in form and details may be made therein without departing from the spirit and scope of the invention as defined by the appended claims.

The invention claimed is:

1. An optical interconnection system comprising:
   an optical printed circuit board (PCB) that includes transmitter-unit and receiver-unit optical interconnection blocks for bending an optical path by a predetermined angle, an integrated optical waveguide including an optical waveguide which is inserted into each of the optical interconnection blocks so as to connect optical paths of the transmitter-unit and receiver-unit optical interconnection blocks, and a PCB having the integrated optical waveguide integrated therein;
   a light emitting element that is formed in-line with the optical waveguide on an upper surface of the transmitter-unit optical interconnection block exposed to an upper surface of the optical PCB;
   a driver integrated circuit that is formed on the upper surface of the optical PCB and electrically connected to the light emitting element and the optical PCB;
   a light receiving element that is formed in-line with the optical waveguide on an upper surface of the receiver-unit optical interconnection block exposed to the upper surface of the optical PCB;
   a receiver integrated circuit that is formed on the upper surface of the optical PCB and electrically connected to the light receiving element and the optical PCB;
   wherein the upper surfaces of the respective optical interconnection blocks are substantially aligned with the upper surface of the PCB;
   wherein the light emitting element is a bottom-surface light emitting element, the bottom-surface light emitting element and the driver integrated circuit are connected to each other through wire bonding, and the driver integrated circuit and the optical PCB are connected to each other through wire bonding; and
   the light receiving element is a bottom-surface light receiving element, the bottom-surface light receiving element and the receiver integrated circuit are connected to each other through wire bonding, and the receiver integrated circuit and the optical PCB are connected to each other through wire bonding.

2. The optical interconnection system according to claim 1, wherein the optical waveguide of the optical PCB is formed by integrating an optical fiber, polymer waveguide, or ribbon-type fiber in the optical PCB.

3. An optical interconnection system comprising:
   an optical printed circuit board (PCB) that includes transmitter-unit and receiver-unit optical interconnection blocks for bending an optical path by a predetermined angle, an integrated optical waveguide including an optical waveguide which is inserted into each of the optical interconnection blocks so as to connect optical paths of the transmitter-unit and receiver-unit optical interconnection blocks, and a PCB having the integrated optical waveguide integrated therein;
   a light emitting element that is formed in-line with the optical waveguide on an upper surface of the transmitter-unit optical interconnection block exposed to an upper surface of the optical PCB;
   a driver integrated circuit that is formed on the upper surface of the optical PCB and electrically connected to the light emitting element and the optical PCB;
   a light receiving element that is formed in-line with the optical waveguide on an upper surface of the receiver-unit optical interconnection block exposed to the upper surface of the optical PCB;
   a receiver integrated circuit that is formed on the upper surface of the optical PCB and electrically connected to the light receiving element and the optical PCB;
   wherein the upper surfaces of the respective optical interconnection blocks are substantially aligned with the upper surface of the PCB; and
   wherein the light emitting element is an top-surface light emitting element having bumps provided thereon, the light receiving element is an top-surface light receiving element having bumps provided thereon, the driver integrated circuit and the receiver integrated circuit each have bumps provided thereon, and the top-surface light emitting element, the driver integrated circuit, the top-surface light receiving element, and the receiver integrated circuit are packaged on the optical PCB through the bumps by flip-chip bonding.

4. An optical interconnection system comprising:
   an optical transmitter module that includes a transmitter-unit optical interconnection block for bending an optical path by a predetermined angle, a light emitting element formed in-line with an optical waveguide of the optical interconnection block, a driver integrated circuit connected to the light emitting element, and a module PCB having the driver integrated circuit formed on an upper surface thereof;
   an optical receiver module that includes a receiver-unit optical interconnection block for bending an optical path by a predetermined angle, a light receiving element formed in-line with an optical waveguide of the optical interconnection block, a receiver integrated circuit connected to the light receiving element, and a module PCB having the receiver integrated circuit formed on an upper surface thereof;
   an optical PCB that includes an optical waveguide connecting the optical interconnection block of the optical transmitter module and the optical interconnection block of the optical receiver module;
   wherein the optical interconnection block of the optical transmitter module and the optical interconnection block of the optical receiver module are connected to the optical waveguide of the optical PCB through guide pins;

wherein the light emitting element is a bottom-surface light emitting element, the bottom-surface light emitting element and the driver integrated circuit are electrically connected to each other through wire bonding, and the driver integrated circuit and the module PCB are electrically connected to each other through wire bonding; and the light receiving element is a bottom-surface light receiving element, the bottom-surface light receiving element and the receiver integrated circuit are electrically connected to each other through wire bonding, and the receiver integrated circuit and the module PCB are electrically connected to each other through wire bonding.

5. The optical interconnection system according to claim 4, wherein the optical waveguide of the optical PCB is formed by integrating an optical fiber, polymer waveguide, or ribbon-type fiber in the optical PCB.

6. An optical interconnection system comprising:
an optical transmitter module that includes a transmitter-unit optical interconnection block for bending an optical path by a predetermined angle, a light emitting element formed in-line with an optical waveguide of the optical interconnection block, a driver integrated circuit connected to the light emitting element, and a module PCB having the driver integrated circuit formed on an upper surface thereof;
an optical receiver module that includes a receiver-unit optical interconnection block for bending an optical path by a predetermined angle, a light receiving element formed in-line with an optical waveguide of the optical interconnection block, a receiver integrated circuit connected to the light receiving element, and a module PCB having the receiver integrated circuit formed on an upper surface thereof;
an optical PCB that includes an optical waveguide connecting the optical interconnection block of the optical transmitter module and the optical interconnection block of the optical receiver module;
wherein the optical interconnection block of the optical transmitter module and the optical interconnection block of the optical receiver module are connected to the optical waveguide of the optical PCB through guide pins;
wherein the driver integrated circuit and the receiver integrated circuit each have bumps provided thereon;
the light emitting element is a bottom-surface light emitting element, the bottom-surface light emitting element and the module PCB are electrically connected to each other through wire bonding, and the driver integrated circuit is packaged on the module PCB through the bumps by flip-chip bonding; and
the light receiving element is a bottom-surface light receiving element, the bottom-surface light receiving element and the module PCB are electrically connected to each other through wire bonding, and the receiver integrated circuit is packaged on the module PCB through the bumps by flip-chip bonding.

7. An optical interconnection system comprising:
an optical transmitter module that includes a transmitter-unit optical interconnection block for bending an optical path by a predetermined angle, a light emitting element formed in-line with an optical waveguide of the optical interconnection block through a first guide pin, a driver integrated circuit connected to the light emitting element, and a transmitter-unit flexible module PCB having the driver integrated circuit formed on an upper surface thereof;
an optical receiver module that includes a receiver-unit optical interconnection block for bending an optical path by a predetermined angle, a light receiving element formed in-line with an optical waveguide of the optical interconnection block through a first guide pin, a receiver integrated circuit connected to the light receiving element, and a receiver-unit flexible module PCB having the receiver integrated circuit formed on an upper surface thereof;
an optical PCB that includes an optical waveguide connecting the optical interconnection block of the optical transmitter module and the optical interconnection block of the optical receiver block;
wherein each of the flexible module PCBs has a guide hole through which the first guide pin passes, and the optical interconnection blocks of the optical transmitter module and the optical receiver module are connected to the optical waveguide of the optical PCB through second guide pins;
wherein the light emitting and receiving elements are top-surface light emitting and receiving elements having bumps provided thereon, and are packaged on first surfaces of the flexible module PCBs through flip-chip bonding; and
the driver integrated circuit and the receiver integrated circuit are electrically connected to second surfaces of the flexible module PCBs through wire bonding.

8. The optical interconnection system according to claim 7, wherein the optical waveguide of the optical PCB is formed by integrating an optical fiber, polymer waveguide, or ribbon-type fiber in the optical PCB.

9. An optical interconnection system comprising:
an optical transmitter module that includes a transmitter-unit optical interconnection block for bending an optical path by a predetermined angle, a light emitting element formed in-line with an optical waveguide of the optical interconnection block through a first guide pin, a driver integrated circuit connected to the light emitting element, and a transmitter-unit flexible module PCB having the driver integrated circuit formed on an upper surface thereof;
an optical receiver module that includes a receiver-unit optical interconnection block for bending an optical path by a predetermined angle, a light receiving element formed in-line with an optical waveguide of the optical interconnection block through a first guide pin, a receiver integrated circuit connected to the light receiving element, and a receiver-unit flexible module PCB having the receiver integrated circuit formed on an upper surface thereof;
an optical PCB that includes an optical waveguide connecting the optical interconnection block of the optical transmitter module and the optical interconnection block of the optical receiver block;
wherein each of the flexible module PCBs has a guide hole through which the first guide pin passes, and the optical interconnection blocks of the optical transmitter module and the optical receiver module are connected to the optical waveguide of the optical PCB through second guide pins;
wherein the light emitting and receiving elements are top-surface light emitting and receiving elements having bumps provided thereon, and are packaged on first surfaces of the flexible module PCBs through flip-chip bonding and the driver integrated circuit and the receiver integrated circuit have bumps provided thereon and are packaged on second surfaces of the flexible module PCBs through flip-chip bonding.

10. An optical interconnection system comprising:

an optical transmitter module that includes a transmitter-unit optical interconnection block for bending an optical path by a predetermined angle, a light emitting element formed in-line with an optical waveguide of the optical interconnection block through a first guide pin, a driver integrated circuit connected to the light emitting element, and a transmitter-unit flexible module PCB having the driver integrated circuit formed on an upper surface thereof;

an optical receiver module that includes a receiver-unit optical interconnection block for bending an optical path by a predetermined angle, a light receiving element formed in-line with an optical waveguide of the optical interconnection block through a first guide pin, a receiver integrated circuit connected to the light receiving element, and a receiver-unit flexible module PCB having the receiver integrated circuit formed on an upper surface thereof;

an optical PCB that includes an optical waveguide connecting the optical interconnection block of the optical transmitter module and the optical interconnection block of the optical receiver block;

wherein each of the flexible module PCBs has a guide hole through which the first guide pin passes, and the optical interconnection blocks of the optical transmitter module and the optical receiver module are connected to the optical waveguide of the optical PCB through second guide pins;

wherein the light emitting and receiving elements are bottom-surface light emitting and receiving elements having bumps provided thereon, and are packaged under first surfaces of the flexible module PCBs through flip-chip bonding; and the driver integrated circuit and the receiver integrated circuit are electrically connected to second surfaces of the flexible module PCBs through wire bonding.

11. An optical interconnection system comprising:

an optical transmitter module that includes a transmitter-unit optical interconnection block for bending an optical path by a predetermined angle, a light emitting element formed in-line with an optical waveguide of the optical interconnection block through a first guide pin, a driver integrated circuit connected to the light emitting element, and a transmitter-unit flexible module PCB having the driver integrated circuit formed on an upper surface thereof;

an optical receiver module that includes a receiver-unit optical interconnection block for bending an optical path by a predetermined angle, a light receiving element formed in-line with an optical waveguide of the optical interconnection block through a first guide pin, a receiver integrated circuit connected to the light receiving element, and a receiver-unit flexible module PCB having the receiver integrated circuit formed on an upper surface thereof;

an optical PCB that includes an optical waveguide connecting the optical interconnection block of the optical transmitter module and the optical interconnection block of the optical receiver block;

wherein each of the flexible module PCBs has a guide hole through which the first guide pin passes, and the optical interconnection blocks of the optical transmitter module and the optical receiver module are connected to the optical waveguide of the optical PCB through second guide pins;

wherein the light emitting and receiving elements are bottom-surface light emitting and receiving elements having bumps provided thereon, and are packaged under first surfaces of the flexible module PCBs through flip-chip bonding; and the driver integrated circuit and the receiver integrated circuit have bumps provided thereon and are packaged on second surfaces of the flexible module PCBs through flip-chip bonding.

12. An optical interconnection system comprising:

an optical transmitter module that includes a transmitter-unit optical interconnection block for bending an optical path by a predetermined angle, a light emitting element formed in-line with an optical waveguide of the optical interconnection block, a first PCB having a groove formed therein such that light emitted from the light emitting element passes through the groove, a driver integrated circuit connected to the light emitting element, and a second PCB having the driver integrated circuit formed on an upper surface thereof;

an optical receiver module that includes a receiver-unit optical interconnection block for bending an optical path by a predetermined angle, a light receiving element formed in-line with an optical waveguide of the optical interconnection block, a first PCB having a groove formed therein such that light is transmitted to the light receiving element through the groove, a receiver integrated circuit connected to the light receiving element, and a second PCB having the receiver integrated circuit formed on an upper surface thereof;

an optical PCB that includes an optical waveguide connecting the optical interconnection block of the optical transmitter module and the optical interconnection block of the optical receiver module;

wherein the optical interconnection blocks of the optical transmitter module and the optical receiver module are connected to the optical waveguide of the optical PCB through guide pins;

wherein the light emitting element is a bottom-surface light emitting element, the bottom-surface light emitting element is connected to the first PCB through wire bonding, the driver integrated circuit is connected to the second PCB through wire bonding, and the first and second PCBs are bonded through a ball grid array so as to be electrically connected to each other; and the light receiving element is a bottom-surface light emitting element, the bottom-surface light emitting element is connected to the first PCB through wire bonding, the receiver integrated circuit is connected to the second PCB through wire bonding, and the first and second PCBs are bonded through a ball grid array so as to be electrically connected to each other.

13. The optical interconnection system according to claim 12, wherein the optical waveguide of the optical PCB is formed by integrating an optical fiber, polymer waveguide, or ribbon-type fiber in the optical PCB.

14. An optical interconnection system comprising:

an optical transmitter module that includes a transmitter-unit optical interconnection block for bending an optical path by a predetermined angle, a light emitting element formed in-line with an optical waveguide of the optical interconnection block, a first PCB having a groove formed therein such that light emitted from the light emitting element passes through the groove, a driver integrated circuit connected to the light emitting element, and a second PCB having the driver integrated circuit formed on an upper surface thereof;

an optical receiver module that includes a receiver-unit optical interconnection block for bending an optical path by a predetermined angle, a light receiving element formed in-line with an optical waveguide of the optical interconnection block, a first PCB having a groove formed therein such that light is transmitted to the light receiving element through the groove, a receiver integrated circuit connected to the light receiving element, and a second PCB having the receiver integrated circuit formed on an upper surface thereof;

an optical PCB that includes an optical waveguide connecting the optical interconnection block of the optical transmitter module and the optical interconnection block of the optical receiver module;

wherein the optical interconnection blocks of the optical transmitter module and the optical receiver module are connected to the optical waveguide of the optical PCB through guide pins;

wherein the light emitting element is a bottom-surface light emitting element, the bottom-surface light emitting element is connected to the first PCB through wire bonding, the driver integrated circuit has bumps provided thereon and is packaged on the second PCB through flip-chip bonding, and the first and second PCBs are bonded through a ball grid array so as to be electrically connected to each other; and the light receiving element is a bottom-surface light emitting element, the bottom-surface light emitting element is connected to the first PCB through wire bonding, the receiver integrated circuit has bumps provided thereon and is packaged on the second PCB through flip-chip bonding, and the first and second PCBs are bonded through a ball grid array so as to be electrically connected to each other.

* * * * *